United States Patent [19]

Bonnie et al.

[11] 4,164,027
[45] Aug. 7, 1979

[54] FAULT TOLERANT BUBBLE MEMORY WITH A SINGLE MAJOR LOOP HAVING AN INTEGRAL STATIONARY REGISTER

[75] Inventors: G. Patrick Bonnie, Minneapolis; William J. McGinnis, Jr., Prior Lake, both of Minn.

[73] Assignee: Control Data Corporation, Minneapolis, Minn.

[21] Appl. No.: 894,444

[22] Filed: Apr. 7, 1978

[51] Int. Cl.$^2$ ............................................. G11C 19/08
[52] U.S. Cl. ......................................... 365/15; 365/17
[58] Field of Search ................................. 365/15, 17

[56] References Cited

U.S. PATENT DOCUMENTS

| 4,056,812 | 11/1977 | Bobeck et al. | 365/17 |
| 4,125,875 | 11/1978 | Saito | 365/17 |

Primary Examiner—James W. Moffitt
Attorney, Agent, or Firm—William J. McGinnis, Jr.

[57] ABSTRACT

In a field access type bubble memory system using a major loop minor loop organization, additional redundant minor loops are included in each memory device so that defective minor loops may be disregarded and the memory retain its nominal capacity. Thus, the total number of minor loops is in excess of the nominal capacity. A stationary register is formed integrally with the major loop by coupling bubble idlers directly to the major loop bubble propagation path. The stationary register has as many register positions as the total number of minor loops coupled to the major loop. An appropriate binary code identifies in the appropriate register location the corresponding minor loop which is defective, including nominally defective minor loops, if necessary, so that a number of minor loops equal to the nominal capacity of the memory are identified as good. Each time the memory is accessed, the contents of the stationary register are accessed, nondestructively, and read into and combined with the contents of the major loop on an every other one basis. Appropriate logic identifies which minor loop is to receive data and those minor loops from which data can be read. A single conductor can be used to control access from both the stationary register and the minor loops to the major loop or separate conductors may be used for the stationary register and the minor loops.

3 Claims, 4 Drawing Figures

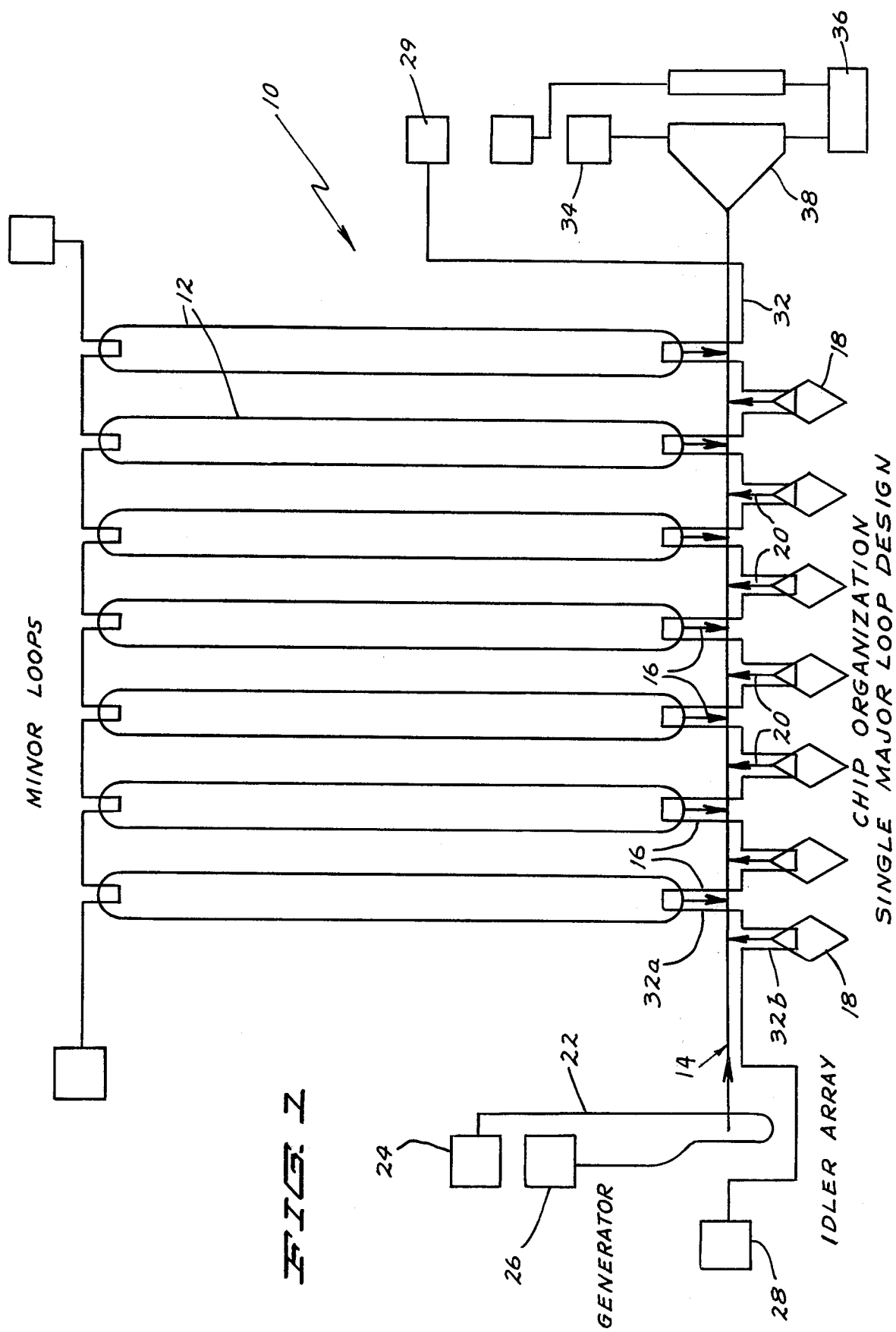

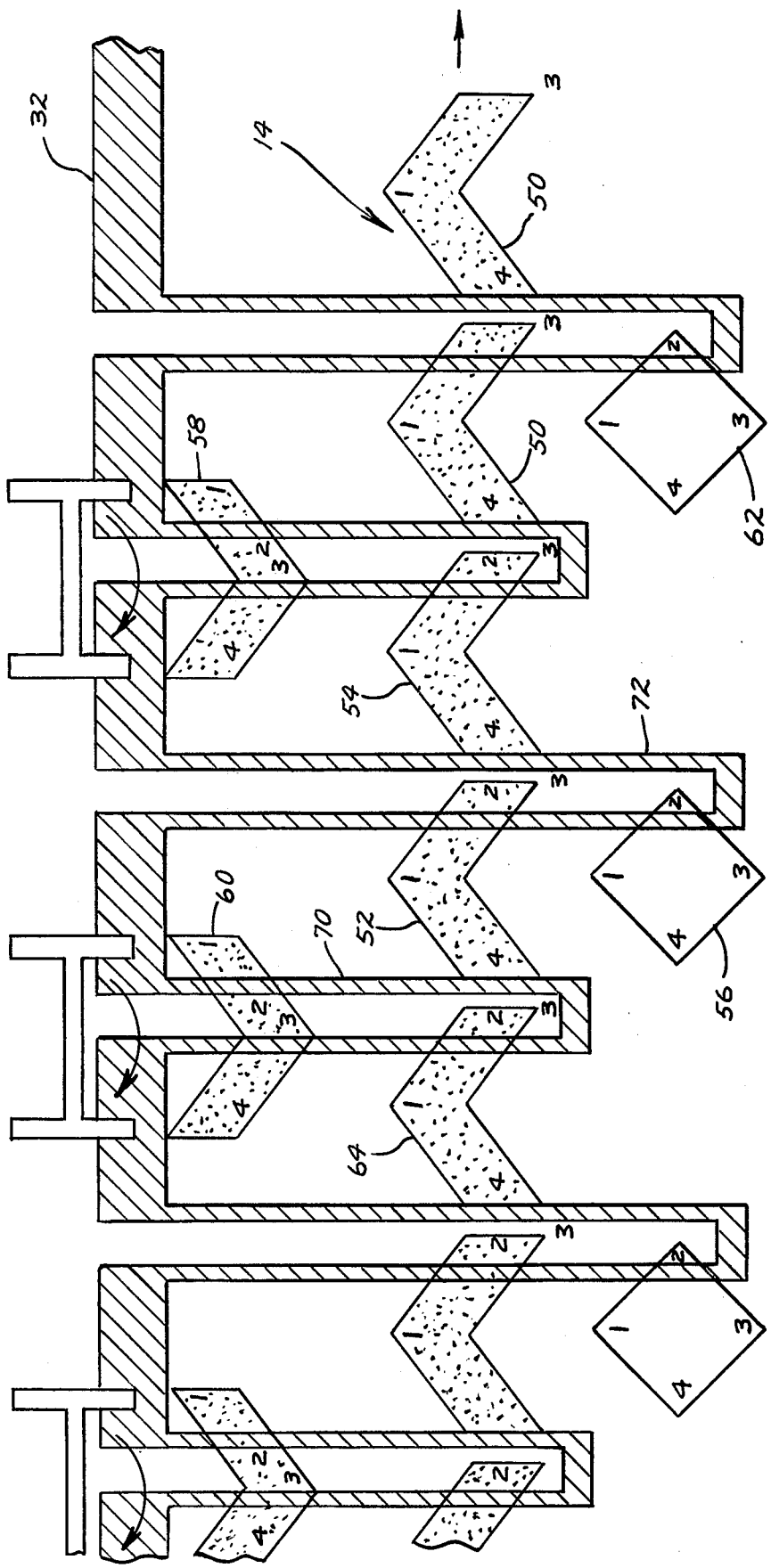

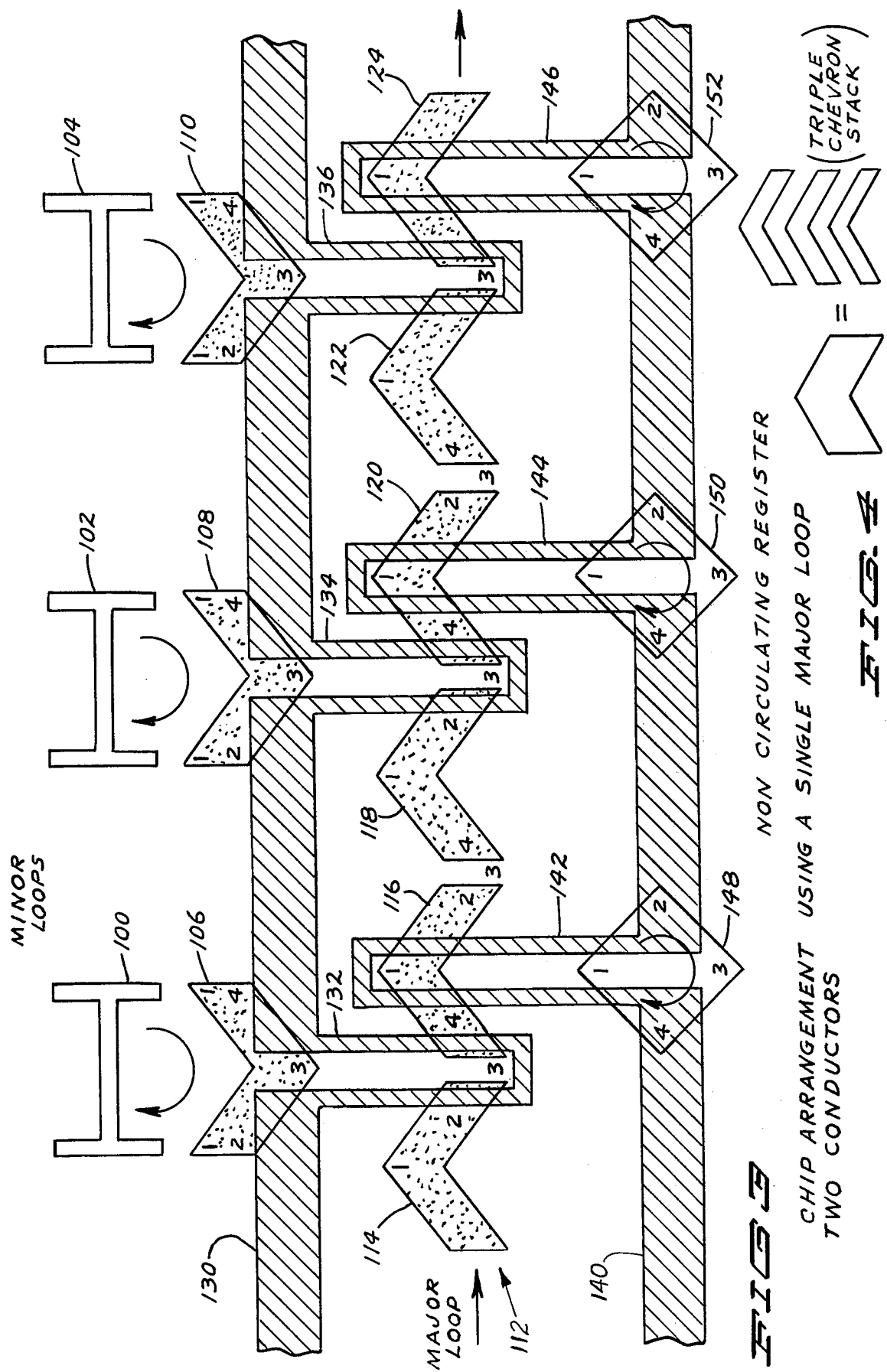

FAULT TOLERANT BUBBLE MEMORY WITH A SINGLE MAJOR LOOP HAVING AN INTEGRAL STATIONARY REGISTER

RELATED APPLICATION DATA

This application is related to the following applications owned by the same assignee as this application: (I) NONCIRCULATING REGISTER FOR BUBBLE MEMORY SYSTEMS, Ser. No. 841,506, filed on Oct. 12, 1977; (II) FAULT TOLERANT SYSTEM FOR BUBBLE MEMORIES, Ser. No. 846,290, filed on Oct. 28, 1977 now U.S. Pat. No. 4,145,757; (III) FAULT TOLERANT BUBBLE MEMORY WITH REDUNDANCY USING A STATIONARY REGISTER ON A SINGLE CHIP, Ser. No. 841,505, filed on Oct. 12, 1977.

BACKGROUND OF THE INVENTION

This invention relates generally to fault tolerant bubble memory design. More particularly, this application is related to an invention for a bubble memory design having additional minor loops in a major loop-minor loop field access design and a stationary register having the same number of positions as the total number of minor loops so that defective minor loops are internally identified in the memory.

In conventional manufacturing processes for bubble memory chips, a certain number of chips will prove to be defective and have to be discarded. Normal manufacturing control requires a certain trade-off between manufacturing 100% perfect devices and testing after the manufacturing process to discard or repair defective units. Obviously, defective memory chips cannot be repaired so the testing process must require that defective chips be discarded. Various designs in the prior art exist to increase the manufacturing process yield by designing bubble memory chips in such a way that a certain number of faults or defects may exists and yet have the chip usable in the particular bubble memory system. Many such fault tolerant designs exist employing both external logic and memory as well as various modifications of a standard chip design or combinations of both.

One system employing a modified chip design is shown in U.S. Pat. No. 3,921,156. In a normal major loop-minor loop field access memory design, the subject patent shows various bubble bypass circuits or loops in the system which may be semipermanently altered to eliminate defective minor loops. Such systems require comparatively complex bubble-bubble interactions on the memory chip in order to perform the path diversion logic functions and may be comparatively less reliable than certain externally performed logic functions.

Another concept involving alteration of magnetic paths from magnetic bubbles is shown in U.S. Pat. No. 3,990,058. However, the present application is based on major loop-minor loop organization rather than the alteration of paths in a serial memory. Furthermore, the present application does not involve alteration of magnetic bubble paths. U.S. Pat. No. 3,909,810 shows a scheme where extra minor loops are included in a bubble memory system and external memory sources are used together with logic devices to identify minor loops which are to be ignored in favor of the usable minor loops. Thus, all of the fault tolerance ability of the system shown in this patent is based on external logic devices while the memory chip differs from conventional memory chips only in that an excess number of minor loops are included on the chip in excess of the nominal capacity of the memory in order to allow for elimination of certain minor loops after testing. U.S. Pat. No. 4,073,012 shows a fault tolerant bubble memory which uses external logic and an external memory to contain faulty loop data.

U.S. Pat. No. 3,792,450 shows the use of a major loop-minor loop memory system having additional minor loops which are used for the purpose of containing a flaw table to identify the minor loop locations which are defective. This results in additional complexity to the memory in that additional connections and read gates are required to the memory chip to allow independent reading of the minor loop flaw tables. Further, care in design and construction of the system is required to insure than the proper synchronization is maintained between the minor loop and the remainder of the memory so that the correct correspondence is maintained in identity between indications of faulty minor loops and the actual faulty minor loops.

The present invention contains certain advantages in that synchronization of the flaw table is automatically constantly maintained with respect to faulty minor loop locations. Further, connections to the memory chip, according to the design of the invention, are not unnecessarily increased in that serial, merged reading of the stationary register and major loop is done by a common read gate. A further advantage of the present invention is that no separate or external memory device needs to be programmed with the fault information since that is designed into each individual memory chip.

SUMMARY OF THE INVENTION

The present invention consists of a fault tolerant bubble memory chip based on the field access major loop minor loop organization. The major loop incorporates a stationary register having a plurality of bubble idlers adjacent thereto and selectively coupled to the major loop as the propagation path portion of the stationary register. The stationary register access locations are spaced from the corresponding minor loop locations for access purposes so that the stationary register contains a corrsponding bit for each minor loop. The bit stored in the bubble idler for each minor loop contains the information in binary form as to whether the corresponding minor loop is usable or nonusable. The noncirculating register reads into the propagation track of the major loop upon the coupling mechanism consisting of an electrical conductor loop being actuated. The invention consists of two embodiments, one of which comprises a single conductor loop causing simultaneous access of both minor loops and the bubble idlers into the major loop propagation path. The other embodiment of the invention has two separate conductor loops, one for the bubble idlers forming the stationary register and the other for the minor loops in conjunction with the major loop. In reading, the contents of the major loop and the bubble idlers are read into the propagation path in a merged fashion so that every other bit represents the contents of a bubble idler while the intervening bits represent the contents of a minor loop.

In the Figures:

FIG. 1 is a schematic diagram of a bubble memory chip according to the present invention;

FIG. 2 is a detailed view of a segment of a bubble memory chip according to the embodiment of FIG. 1;

FIG. 3 is a detailed view of a portion of a bubble memory chip according to another embodiment of the present invention; and FIG. 4 shows the use of a large chevron symbol to indicate a triple chevron stack.

DESCRIPTION OF THE PREFERRED EMBODIMENTS

Referring now to FIG. 1, a bubble memory chip 10 according to the present invention is shown schematically. Conventional minor loops 12 are shown diagrammatically. The number of minor loops 12 shown is in excess of the nominal desired capacity of the memory. For example, 7 minor loops are shown and the desired nominal capacity of the memory is to be six bits so that the excess capacity consists of a single loop. This will allow for a single defective loop. To expand further on this concept, a memory having a nominal word length of 256 bits, corresponding to 256 usable minor loops could have an additional 8 or even 16 minor loops in excess of the nominal capacity to allow for 8 or 16, respectively, defective minor loops.

A major loop 14 associated with the minor loops 12 is shown diagrammatically by a single line together with an arrow noting the direction of propagation. Arrows 16 schematically illustrate the connection mechanism between the minor loops and major loop 14. In FIGS. 2 and 3 the details of this connection mechanism are shown for particular embodiments. Schematically represented as diamonds, bubble idlers 18 are associated with the major loop 14 in a position displaced relationship and the connection mechanism between the bubble idlers and the major loop is shown diagrammatically by arrows 20.

A bubble generator current loop 22 is shown schematically and is connected to electrical connectors 24 and 26 for connection external equipment device. Electrical connections 28 and 29 connect to the conductor loop 32 which provides access control between the bubble idlers 18 and the minor loops 12 to the propagation path 14 of the major loop. Electrical connections 34 and 36 are connected to a bubble detecting device 38.

Referring now to FIG. 2, which illustratively shows in detail the arrangement of magnetic elements on a bubble memory chip substrate corresponding to the arrangement shown diagrammatically in FIG. 1. The bubble memory major loop propagation path shown diagrammatically in FIG. 1 by reference 14 is shown in detail in an embodiment comprised of chevron propagation elements known in the existing bubble memory art. The large chevron designs symbols 50 comprising the propagation path are used to represent three individual chevron elements placed close to each other as is known in the bubble memory art. Thus, the chevron design symbol simplifies the understanding of the drawing without sacrificing any element of detail. Thus, bubble memory elements 52 and 54 allow a coupling and transfer of magnetic bubbles according to the 1-2-3-4 sequence indicated thereon by small numerals in the presence of a clockwise rotational magnetic field. Bubble idlers which may be in the form of diamonds such as bubble idler element 56 correspond to the same 1-2-3-4 sequence of a traveling a bubble element in response to the same clockwise rotational magnetic field. The conductor loop 32 is shown in detail as connecting between the major loop propagation path, chevron elements 58 and 60 associated with adjacent minor loops and bubble idlers 56 and 62. When conductor 32 has appropriately pulsed a bubble appearing on chevron element 60 in an appropriate location may be transferred to chevron element 64 in the major loop propagation path 14. Similarly, bubbles in the major loop propagation path may be transferred to the minor loops is the chevron elements according to transfer techniques shown in the existing bubble memory art.

Forming the basis of the present invention, however, is the relationship of the major loop to the minor loops in that the minor loops do not transfer or receive bubbles from every available position in the major loop but from every other available position. In the intervening positions in the major loop between the associated minor loops, is where the various bubble idlers are located for storing information concerning the usability of the associated minor loop. Thus, bubble idler 56 has access to the major loop between the positions occupied by minor loops 58 and 60. The information content of bubble idler 56 may arbitrarily be said to represent the usability of the information bit stored in minor loop 60 so that as information is read from the bubble memory into the major loop, the usability information from bubble idler 56 is received into the major loop just prior to the affected data bit from the minor loop 60.

Conductor 32 is so configured that current loops associated with the minor loops, such as minor loops 58 and 60 transfer to the appropriate bit locations of the major loop. Thus, a current loop 70 of conductor 32 is associated with the transfer of magnetic bubbles from minor loop 60. Additional current loops 72 are formed in conductor 32 to associatively couple the contents of bubble idlers such as the associated bubble idler 56 with current loop 72 to the major loop propagation path. Bubble idlers 56 and 62, although shown as a diamond shape configuration may be any appropriate form of bubble idler. Similarly, the propagation path of the major loop does not need to be of the chevron type of magnetic element but may be of other types of known propagation paths.

Referring now to FIG. 3, the ends of three minor loops 100, 102 and 104 are schematically shown. Chevron elements, again following the symbol that the large chevron symbol represents the triple chevron configuration, 106, 108 and 110 are associated with alternate bit positions of a major loop 112. Chevrons 114, 116, 118, 120, 122 and 124 form the portion of the propagation path shown in FIG. 3. A first conductor 130 having current loops 132, 134 and 136 associated with minor loops 100, 102 and 104 respectively allow for the control of magnetic bubble transfers back and forth between the major loop and the associated minor loops. In addition, a second conductor 140 having current loops 142, 144 and 146 associated with bubble idlers shown in diamond configuration 148, 150 and 152 allows for the control of propagation of bubbles back and forth between the respective bubble idlers and the propagation path of the major loop 112. Operation of this embodiment of the invention is similar to that of the operation of the embodiment shown in FIG. 2 except that the conductor loops 140 and 130 may be activated at different times or with currents of different strengths to allow somewhat more flexibility than the operation of a bubble memory chip according to the design of this invention.

Once the information has been read into the major loop for storage in the memory or once information has been read from the bubble idlers and from the minor loops into the major loop for reading out of the memory, operation of this invention can be understood as being similar to the operation of the invention identified in patent application Ser. No. 846,290 and Ser. No. 841,505 owned by the assignee of the present invention and previously identified.

It should be noted that the use of diamond shaped bubble idlers and chevron type propagation elements to illustrate the invention is not meant to be limiting and the invention may be practiced with other types of bubble idlers and propagation tracks in various combinations.

What is claimed is:

1. A fault tolerant bubble memory device comprising, a field access type bubble memory employing the major loop minor loop configuration having additional redundant minor loops, all minor loops being associated with a major loop, said major loop having a bubble access location for a magnetic bubble associated with each minor loop and at least one additional bubble access location between each of the access locations associated with minor loops, a plurality of bubble idlers forming in combination with a propagation path portion of the major loop a stationary register having a position displaced relationship to the bubble access location of the associated minor loops, said stationary register being formed in part from a serial propagation track portion of said major loop whereby bubble elements move from one location to another in the presence of a rotating in-plane magnetic field and said bubble idlers being placed in an array form parallel and adjacent to said propagation track portion of said major loop, each idler being associated with one of said additional bubble access locations, and electrical conductor means for activating a transfer of magnetic bubbles between major loop locations and minor loop locations and between major loop locations and bubble idler locations, said electrical conductor means generally following the path of said propagation track portion of said major loop and having associated with each idler element a current loop of said conductor means such that pulses of current in said conductor means may control transfer of bubbles into and out of said propagation track portion of said major loop.

2. The apparatus of claim 1 wherein said means for activating a transfer is comprised of a single conductor having conductor loops associated between a plurality of first bubble access locations in said major loop and each of said minor loops and a second plurality of conductor loops associated with a second plurality of bubble access locations in said major loop comprised in a generally alternating relationship with said first plurality of locations in said major loop and said plurality of bubble idlers.

3. The apparatus of claim 1 whereas said means for activating a transfer of bubbles is comprised of a first conductor having a first plurality of conductor loops associated between a plurality of first bubble access locations on said major loop and each of said minor loops and further comprising a second conductor having a second plurality of conductor loops associated with a second plurality of alternate bubble access locations in said major loop and said plurality of bubble idlers.

* * * * *